United States Patent [19]

Roecks et al.

[11] 4,196,512
[45] Apr. 8, 1980

[54] CARTRIDGE FEED MECHANISM FOR AXIAL LEAD COMPONENT INSERTER

[75] Inventors: Carl C. Roecks; Stuart C. Baker, both of Palos Verdes Estates, Calif.

[73] Assignee: Amistar Corporation, Torrance, Calif.

[21] Appl. No.: 874,029

[22] Filed: Jan. 31, 1978

[51] Int. Cl.² .................... H05K 3/32; H05K 13/04
[52] U.S. Cl. .................................. 29/741; 29/564.1; 29/759; 29/809; 221/82
[58] Field of Search ............... 29/741, 739, 759, 809, 29/564.1, 564.8; 221/82

[56] References Cited

U.S. PATENT DOCUMENTS

| | | |
|---|---|---|
| 3,252,615 | 5/1966 | Hill et al. ............................ 221/82 |
| 3,926,335 | 12/1975 | Dangles et al. ..................... 221/82 |
| 4,068,373 | 1/1978 | Bell et al. ............................ 29/741 |
| 4,070,753 | 1/1978 | Liu .................................... 29/741 |

Primary Examiner—Carl E. Hall
Attorney, Agent, or Firm—John Holtrichter, Jr.

[57] ABSTRACT

There is herein disclosed a cartridge feed mechanism that is used with an axial lead component inserter, the mechanism including an indexed cartridge having an outlet port communicating with a gravity slide leading to the inserter's insertion head, the cartridge having a plurality of radially extending compartments adapted to temporarily house axial lead components until the cartridge is indexed registering a compartment with the outlet port.

10 Claims, 8 Drawing Figures

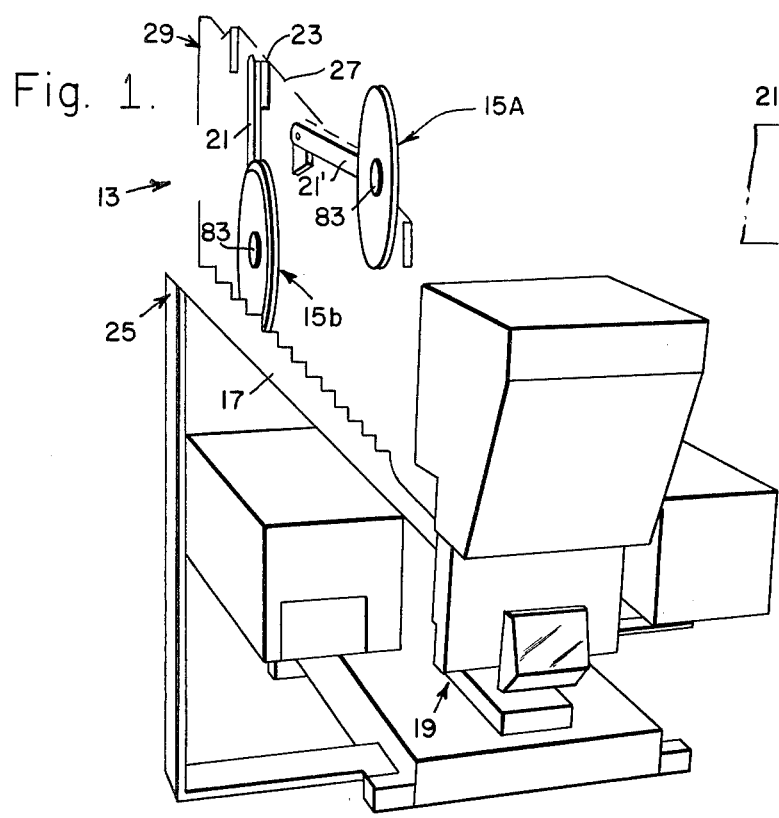
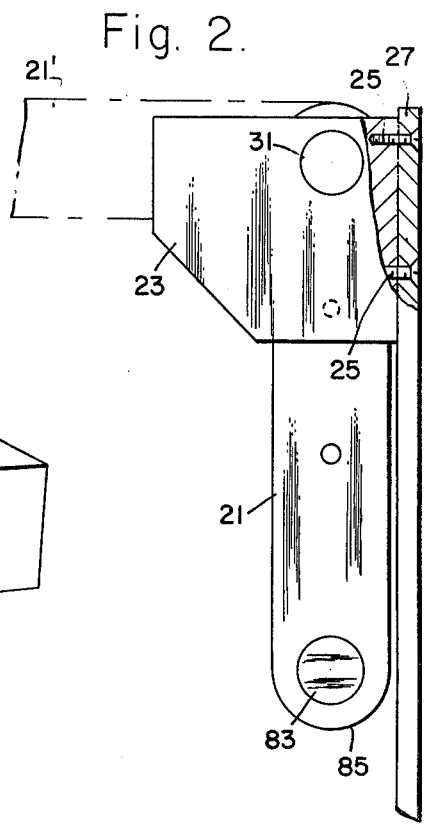
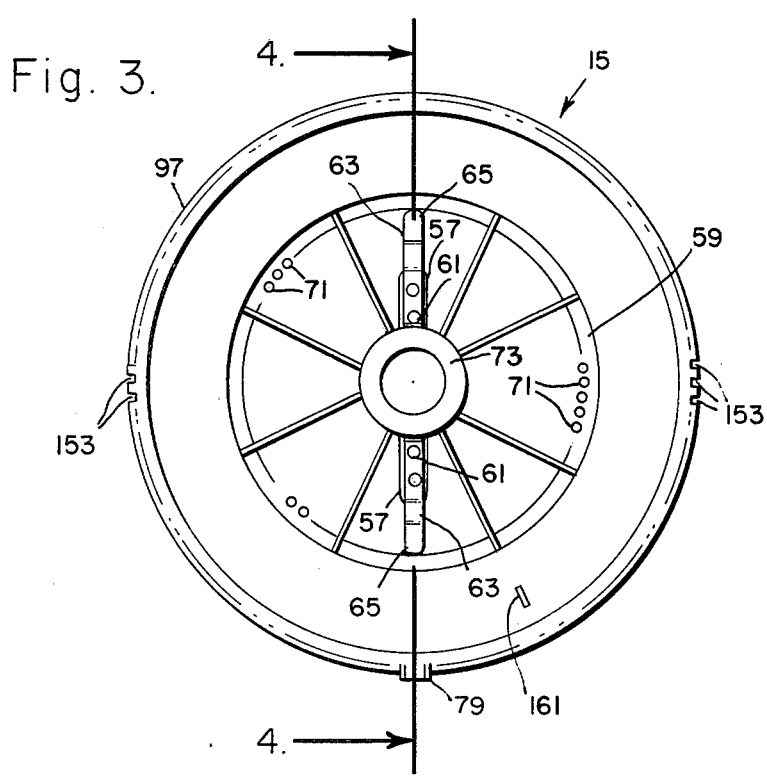
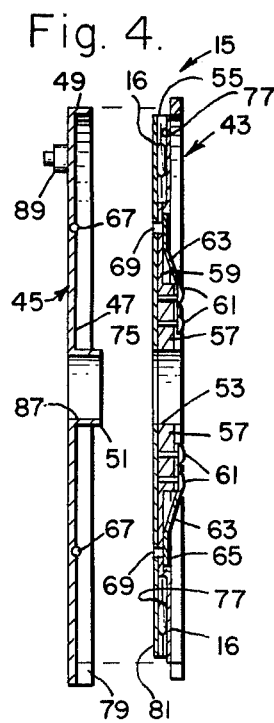

CARTRIDGE FEED MECHANISM FOR AXIAL LEAD COMPONENT INSERTER

BACKGROUND OF THE INVENTION

The background of the invention will be set forth in two parts.

1. Field of the Invention

This invention relates to the electronics manufacturing industry and more particularly to feed mechanisms for axial lead component inserters.

2. Description of the Prior Art

An axial lead component inserter is designed to accept axial lead electronic components with cylindrical bodies, to form these into an inverted U or staple shape and to insert these into a printed circuit boards quickly and efficiently. The board to be loaded is hand held, and then located by placing the holes for the component over two tapered pins. After insertion, the protruding wires are clinched to retain the component on the board.

In the past, an axial lead component inserter, as for example described in a copending patent application, Ser. No. 771,731, filed Feb. 24, 1977, and owned by the inventor of the present application, accepts axial lead components from reels which are mounted directly on the machine. One to four reels may be accommodated, and are selected by means of either push-bottons, one for each reel, or by a pre-punched paper tape program. The parts are cut from each reel by a separate cutter and fed to the insertion head by gravity.

The reels hold the full length components in a horizontal orientation in such a way that only a limited number of reels may be mounted on the inserter. This severly limits the variety of components that may be loaded on a board without necessitating the exchanging of reels with those holding different values or types of axial lead components. It should thus be evident that an improved means for delivering components to the inserter which allowed a substantial increase in the variety of components immediately deliverable to the insertion head would constitute a significant advancement of the art.

SUMMARY OF THE INVENTION

In view of the foregoing factors and conditions characteristic of the prior art, it is a primary object of the present invention to provide an improved feed mechanism for an axial lead component inserter.

Another object of the present invention is to provide a cartridge feed mechanism for an axial lead component inserter.

Still another object of the present invention is to provide an efficient and reliable cartridge feed mechanism for an axial lead component inserter that allows significantly more storage for components to be fed to the insertion head.

Yet another object of the present invention is to provide a versatile, flexible and cost-effective cartridge feed mechanism for an axial lead component inserter which eliminates costly inventories of sequenced taped components.

Still a further object of the present invention is to provide a cartridge feed mechanism for an axial lead component inserter that eliminates the problem of sequenced reel obsolescence due to engineering changes of component value, and also eliminates the need for expensive tape sequencing machines.

In accordance with an embodiment of the present invention, a cartridge feed mechanism for an axial lead component inserter having a component slide leading to an insertion head includes a cartridge support structure mounted on the inserter, and a circular cartridge removably mounted on the cartridge support structure, the cartridge including an outlet port communicable with the component slide, a plurality of adjacent radially-extending component compartments each successively communicable with the outlet port. The invention also includes sequencing means mounted on the inserter and operatively coupled to the cartridge for sequentially registering the component compartments with the outlet port.

The cartridge support structure may be rotatably mounted on the inserter and may be moved to a mounting/unmounting position and to an operating position where the outlet port of the cartridge is positioned immediately above the component slide. In accordance with embodiments of the invention, the outlet port may be formed in a stationary portion of the cartridge and the component compartments in a rotatable portion thereof, the latter portion including sequencing structure associated with each of the component compartments, the sequencing structure being engaged by a portion of the sequencing means.

The feature of the present invention which are believed to be novel are set forth with particularity in the appended claims. The present invention, both as to its organization and manner of operation, together with further objects and advantages thereof, may best be understood by making reference to the following description taken in conjuction with the accompanying drawing in which like reference characters refer to like elements of the several views.

BRIEF DESCRIPTION OF THE DRAWINGS

FIG. 1 is a perspective view of an axial lead component inserter including a cartridge feed mechanism constructed in accordance with the present invention;

FIG. 2 is a side elevational view of a cartridge support structure in accordance with an embodiment of the invention;

FIG. 3 is a side elevational view of a component cartridge in accordance with the present invention;

FIG. 4 is a sectional view (exploded) of the cartridge of FIG. 3, taken along line 4—4.

DESCRIPTION OF THE PREFERRED EMBODIMENTS

Figure 5:
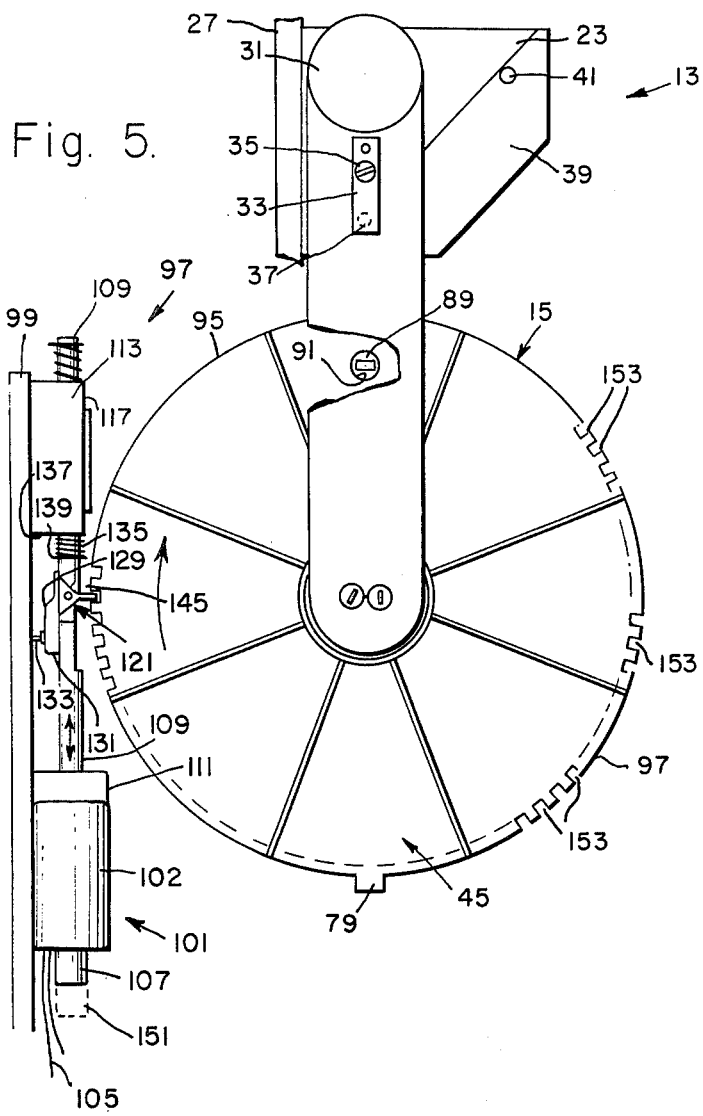
FIG. 5 is a side elevational illustration showing the sequencing mechanism portion of an embodiment of the present invention.

Referring now to the drawings and more particularly to FIGS. 1-4, there is shown an axial lead component inserter 11 utilizing cartridge feed mechanisms generally designated 13, and including cartridges 15, to selectively deposit axial lead components 16 into a multiapertured slide 17 leading to an insertion head section 19.

As best viewed in FIG. 2, a cartridge feed mechanism 13 also includes a cartridge support arm 21 pivotally mounted on a block 23 attached by screws 25 to an upper support plate 27 of a feed support structure 29. The arm 21 pivots about a pin 31 between the operational position shown by the solid outline and the load position shown by the dashed outline 21', in FIG. 2. A cartridge 15 mounted on an arm in its cartridge load-/unload position is also illustrated in FIG. 1. The arm 21 is secured in either of these positions by detent arrangement composed of a flat spring 33 retained on the side of the arm 21 by a screw 35, the spring overlapping a small ball, shown as a dashed outline 37 in FIG. 5, that is trapped in a hole extending through the arm to the opposite side. The spring biases the ball 37 toward the adjacent side 39 of the block 23 requiring some force to move the arm between its two extreme positions whereat the ball partially resides in detent depressions 41 in the surface 39.

The cartridge 15, shown in substantial detail in FIGS. 3-4, includes a front disk portion 43 and a mating rear disk portion 45. The inner surface 47 of the rear disk portion 45 includes an outer peripheral rim 49 and a central hub 51, both extending toward the front disk portion 43. The hub 51 slidably fits within a rimmed central hole 53 in the front disk portion, and the rim 49 slidably fits over the peripheral end surface 55 of the portion 43.

Attached to a pair of raised sections 57 on the outer surface 59 of the front disk portion 43 by screws or rivets 61 are springs 63. The ends 65 of the springs 63 bear down on balls 67 that are captured in holes 69 extending through the portion 43. Each ball 67 normally partially resides in one of the circularly arranged spaced depressions 71 in the inner surface 47 of the rear disk portion 45. The two disk portions are held together in a slideable relationship by an annular disk 73 that is bonded by any suitable means such as ultrasonic welding, for example, to the forward edge 75 of the hub 51. This arrangement allows the two disk portions to rotate relative to each other while favoring quiescent locations urged by the detent assembly comprised of the springs 63, the balls 67 and the depressions 71.

The front disk portion 43 also is provided with radially extending elongated compartments 77, each adapted to temporarily house one axial lead component 16. These compartments all communicate with the peripheral end surface 55 of the front disk portion, but components within the compartments can only selectively leave the compartments 77 by way of a single aperture 79 in the rim 49 which overlies the end surface 55. The compartments may be initially molded in the plastic front disk portion 43 or they may be formed by covering adjacent, radially-extending troughs with an annular cover plate 81.

The cartridge 15 is removably mounted on an axle 83 extending from the outer end 85 of the arm 21. With the arm 21 moved to position 21, the central hole 87 in the cartridge 15 is placed over the axle so that an outwardly extending boss 89 on the cartridge 15 registers with and extends through an indexing hole 91 in the arm 21. The relationship of the boss 89 on the cartridge is such that the aperture 79 is immediately over one of the openings 93 in the slide 17 (see FIG. 6) when the arm 21 is moved downwardly to its operative position, as seen in FIG. 5.

Figure 7:
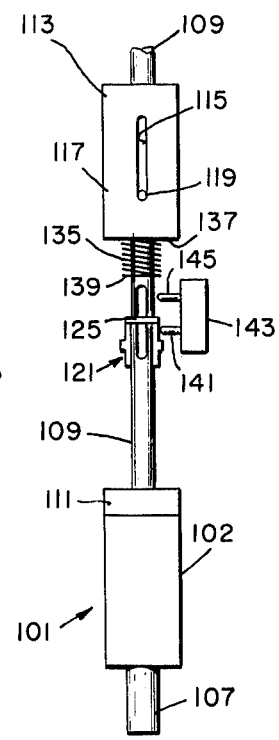
FIG. 7 is an enlarged front view of a portion of the cartridge sequencing mechanism of the present invention.
Figure 6:
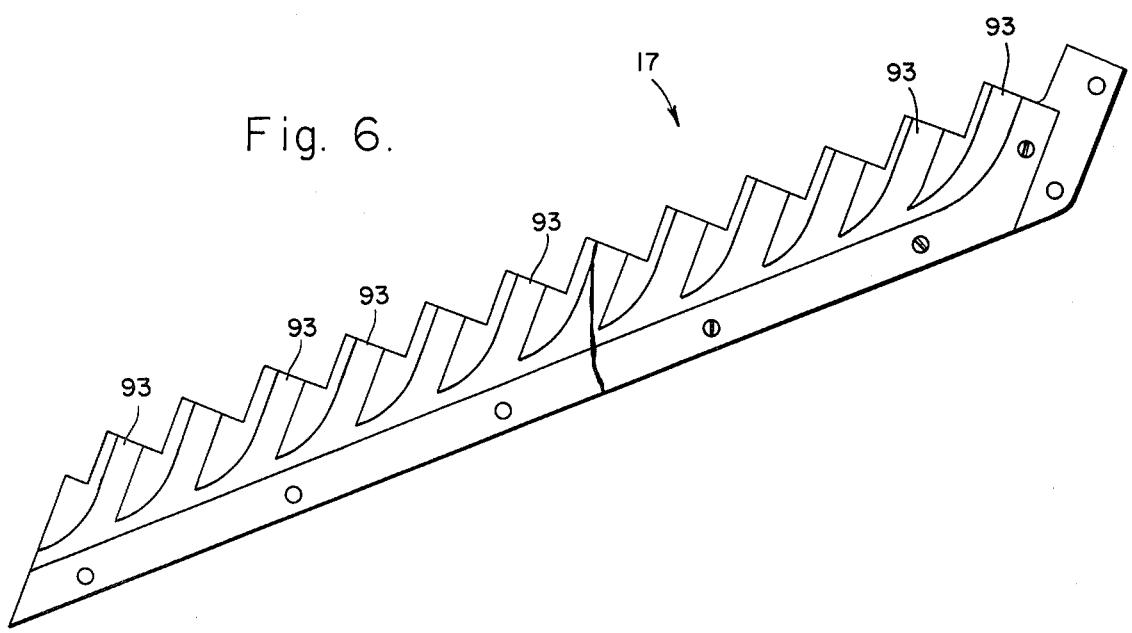
FIG. 6 is an enlarged elevational view, partially broken away, of the component slide shown in FIG. 1.

When the cartridge 15 is in the position shown in FIG. 5 a portion of the peripheral edge 95 is located immediately adjacent a stepping mechanism 97. The mechanism 97 is mounted on a diagonally extending back plate 99 that is supported by the structure 29. The mechanism 97 includes a conventional solenoid 101 having a coil portion 102 with leads 105, and an associated metal core 107 slidably disposed through the coil portion and attached to an elongated rod 109. The coil portion 103 is attached to a bracket 111 mounted to the plate 99, and the rod 109 extends through an aperture in the bracket. The rod extends upwardly through an upper bearing block 113 that includes an elongated slot 115 in its front face 117, in which slot extends a rod rotation-prevention pin 119, as shown in FIG. 7.

Mounted on the rod 109 is a pawl 121 pivotally supported by a pin 123. The pawl 121 includes a slot-engaging transverse portion 125 extending between two side portions 127. The pawl 121 is positionable between a retracted or quiescent position shown in FIGS. 7 and 8, and the forward or active position seen in FIG. 5. The pawl 121 is biased to rotate toward its active position by a flat spring 129 attached to a rod-supported block 131 by a screw 133.

Figure 8:
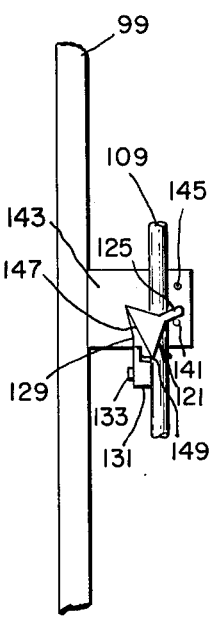
FIG. 8 is a side elevational view of the portion seen in FIG. 7 showing the sequencing mechanism in its retracted or quiescent position.

The rod 109 is biased downwardly toward the mechanism's quiescent position by a coil spring 135, retained between the lower end 137 of the limit block 113 and C-clip 139 mounted on the rod 109. This is illustrated in FIGS. 7 and 8. These figures most clearly show a lower or retract pin 141 contacting the transverse portion 125 and forcing the rotation of the pawl to its quiescent position against the bias of the spring 129. The retract pin 141 extends from a block 143 mounted on the back plate 99. The block 143 also supports a limit pin 145 which halts the upward movement of the pawl. The pawl, this position (see FIG. 5), cannot rotate further because the rear side 147 of the pawl contacts the stop surface 149 of the stop block 131.

In operation, each cartridge is first loaded with a supply of pre-cut axial components such as resistors, capacitors, diodes, inductors and the like, by inserting the same by any means into the radially extending compartments 77. This can be done by sequentially rotating one of the two disk portions of the cartridge relative to the other end inserting a component 16 through the opening 79 into a compartment, and then rotating the disk portion again to allow the deposit of another component into the next compartment, and so on.

Preferably all the components in any one cartridge are alike in value and type, and different types and values of components are carried in different cartridges. For example, cartridge 15A may carry only 10K ohm resistors, while cartridge 15B may carry only signal diodes. Of course, in the case of unidirectional components, the polarity of these devices should be taken into account when loading.

With an arm 21 moved outward and upwardly, the cartridge is attached thereto as previously described. The arm is then lowered into its operative position so that the component in a compartment registering with the opening 79 will fall through the opening and into the slide 17 on its way to the insertion head 19 of the machine. In like manner, other cartridges may be loaded onto associated arms 21.

In its initial configuration, the solenoid core 107 is at its lowest position as noted by the dashed outline 151 in FIG. 5, and the pawl 121 is oriented as shown in FIGS. 7 and 8. The solenoid coil portion 103 is energized by applying an appropriate potential to the leads 105. This causes the core 107 and the rod 109 to be moved upwardly. The upward movement relieves the pawl of pressure from the lower pin 141 and it rotates so that the transverse portion 125 is rotated outwardly by the action of the spring 129.

In this position, the transverse portion of the pawl enters one of a series of notches 153 in the peripheral edge 95 of the cartridge. With continued upward movement of the rod 109, the pawl rotates the front disk portion 43 to expose the next compartment 77 to the opening or outlet port 79, thus releasing a component located therein. The upward movement of the rod and pawl is restricted by the limit pin 145 to a position illustrated in FIG. 5. The position of these pins is such to coincide with the previously mentioned quiescent locations of the detent assembly of each cartridge so as to assure consistent proper registration between each compartment and the outlet port.

Once the rod 109 has reached its limit of upward travel, the coil portion of the solenoid is de-energized. The rod and core then fall downwardly through the force of gravity and the urging of the coil spring 135, to reset the mechanism for the next similar cycle.

The compartments 77 are all immediately adjacent one another except between the first and last where preferably a stop tab 161 extends outwardly from the front surface 59 of the front disk portion 43.

From the foregoing it should be evident that there has herein been described an advantageous device which constitutes a significant advancement in the art.

Although certain materials and types of components have been described in detail, it should be understood that other similar functioning materials and components may be utilized.

We claim:

1. In an axial lead component inserter having a component slide leading to an insertion head, a cartridge feed mechanism, comprising:
   cartridge support structure mounted on said inserter;
   a circular cartridge removably mounted on said cartridge support structure, said cartridge including an outlet port communicable with said component slide, a plurality of adjacent radially-extending component compartments each successively communicable with said outlet port; and
   sequencing means mounted on said inserter and operatively coupled to said cartridge for sequentially registering said component compartments with said outlet port.

2. In the axial lead component inserter according to claim 1, wherein said cartridge support structure includes a swingably movable arm having cartridge support axle disposed thereon, said arm being movable between a cartridge loading/unloading position and an operational position whereat said cartridge is positioned immediately adjacent said sequencing means.

3. In the axial lead component inserter according to claim 2, wherein said cartridge support structure includes a movable arm support member to which said arm is pivotally mounted, said arm and said arm support member including indexing means for favoring said positions of said arm.

4. In the axial lead component inserter according to claim 2, wherein said cartridge includes an arm registration portion, and wherein said arm includes a cartridge registration portion registerable with said arm registration portion positioning said outlet port of said cartridge immediately above said component slide.

5. In the axial lead component inserter according to claim 1, also comprising feed support structure upon which said cartridge support structures and said sequencing means are mounted.

6. In the axial lead component inserter according to claim 1, wherein said cartridge includes two mutually rotatably connected circular disk portions, one of said portions carrying said component compartments and the other of said portions including a compartment closing structure, the latter structure including said outlet port communicable with only one of said component compartments at one time.

7. In the axial lead component inserter according to claim 1, wherein said circular cartridge includes a continuing series of sequencing registering structures, and wherein said sequencing means includes an engagement member registerable with said sequencing registering structures of said cartridges.

8. In the axial lead component inserter according to claim 1, wherein said cartridge includes two coaxially-mounted mutually rotatable disk portions and a detent assembly, the latter assembly favoring relative positions of said disk portions corresponding to each of the adjacent component compartments with respect to said outlet port.

9. In the axial lead component inserter according to claim 1, wherein said sequencing means includes a solenoid structure having a pawl extendable toward said cartridge when it is in an operative position immediately adjacent to said sequencing means, said cartridge including a continuing series of notches in its outer peripheral edge surface, said pawl being movable into one of said notches at a time when said solenoid structure is activated, said activation causing a tangential movement of said pawl with respect to said cartridge when said cartridge is in said operative position, said tangential movement causing said cartridge to rotate a distance to move a next adjacent component compartment in said cartridge to exclusively communicate with said outlet port of said cartridge.

10. In the axial lead component inserter according to claim 1, wherein said sequencing means includes a solenoid assembly having a movable core and includes an elongated rod attached to said core, said sequencing means also including a pawl assembly movably attached to said rod, said pawl being biased to extend outwardly into cartridge engagement position, said sequencing means further including a pawl retract/travel limit structure mounted adjacent said rod, a retract portion of said structure forcing said pawl to move away from said cartridge engagement position against said bias when said solenoid assembly is in a quiescent mode, and a travel limit portion halting the linear movement of said rod and said pawl in said cartridge engagement position when said solenoid assembly is in its active mode.

* * * * *